United States Patent
Mitsui et al.

(10) Patent No.: US 11,881,470 B2
(45) Date of Patent: Jan. 23, 2024

(54) METHOD FOR MANUFACTURING MOUNTING STRUCTURE FOR ELECTRONIC COMPONENT, MOUNTING STRUCTURE FOR ELECTRONIC COMPONENT, ELECTRONIC MODULE, AND WIRING SHEET (71) Applicant: JAPAN AVIATION ELECTRONICS INDUSTRY, LIMITED, Tokyo (JP)

(72) Inventors: Ryosuke Mitsui, Tokyo (JP); Junya Sato, Tokyo (JP); Atsushi Tanaka, Tokyo (JP); Kosuke Matsuo, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 374 days.

(21) Appl. No.: 17/267,887

(22) PCT Filed: Aug. 30, 2019

(86) PCT No.: PCT/JP2019/034178
§ 371 (c)(1),
(2) Date: Feb. 11, 2021

(87) PCT Pub. No.: WO2020/071027
PCT Pub. Date: Apr. 9, 2020

(65) Prior Publication Data
US 2021/0193612 A1 Jun. 24, 2021

(30) Foreign Application Priority Data
Oct. 4, 2018 (JP) .................. 2018-188844

(51) Int. Cl.
*H01L 23/00* (2006.01)
*H01L 23/498* (2006.01)

(52) U.S. Cl.
CPC .......... *H01L 24/92* (2013.01); *H01L 23/4985* (2013.01); *H01L 23/49838* (2013.01);
(Continued)

(58) Field of Classification Search
CPC ......... H01L 24/92; H01L 24/50; H01L 24/32; H01L 24/73; H01L 23/49838;
(Continued)

(56) References Cited

U.S. PATENT DOCUMENTS 6,787,393 B2 * 9/2004 Jin .................. H01L 23/3121
257/784
9,814,142 B1 11/2017 Neuman et al.
(Continued)

FOREIGN PATENT DOCUMENTS

CN 1601936 A 3/2005
JP 2005-252134 A 9/2005
(Continued)

OTHER PUBLICATIONS

U.S. Appl. No. 17/158,439 to Junya Sato et al., which was filed Jan. 26, 2021.
(Continued)

*Primary Examiner* — Jasmine J Clark
(74) *Attorney, Agent, or Firm* — GREENBLUM & BERNSTEIN, P.L.C.

(57) ABSTRACT

In a mounting structure in which an electronic component is mounted on a wiring board, a wiring sheet including an adhesive layer interposes between the electronic component and the wiring board and the electronic component is indirectly mounted on the wiring board. The electronic component is directly mounted on the adhesive layer of the wiring sheet and the adhesive layer of the wiring sheet is directly fitted to the wiring board. Conduction between the electronic component and the wiring board is attained by
(Continued)

conduction between the electronic component and the wiring sheet and conduction between the wiring sheet and the wiring board.

4 Claims, 12 Drawing Sheets

(52) U.S. Cl.
CPC .............. *H01L 24/32* (2013.01); *H01L 24/50* (2013.01); *H01L 24/73* (2013.01); *H01L 2224/32225* (2013.01); *H01L 2224/50* (2013.01); *H01L 2224/73219* (2013.01); *H01L 2224/92148* (2013.01)

(58) Field of Classification Search
CPC . H01L 24/10; H01L 23/4951; H01L 23/4985; H01L 23/49513; H01L 23/49517; H01L 23/4952; H01L 23/49524; H01L 23/49527; H01L 23/49531
USPC ......................................................... 257/773
See application file for complete search history.

(56) References Cited

U.S. PATENT DOCUMENTS

| | | |
|---|---|---|
| 10,700,453 B2 | 6/2020 | Matsuo et al. |
| 2013/0026632 A1* | 1/2013 | Kikuchi .............. H01L 21/6835 257/E23.01 |
| 2020/0145763 A1 | 5/2020 | Nakajima et al. |

FOREIGN PATENT DOCUMENTS

| | | |
|---|---|---|
| JP | 2008-122523 A | 5/2008 |
| JP | 2010-251706 A | 11/2010 |
| JP | 6293938 B1 | 3/2018 |
| WO | 2017/043480 A1 | 3/2017 |

OTHER PUBLICATIONS

Office Action issued in Japanese Counterpart Patent Appl. No. JP2018-188844, dated Oct. 1, 2019, along with an English translation thereof.
Office Action issued in Taiwanese Counterpart Patent Appl. No. 108135799, dated Aug. 31, 2020, along with an English translation thereof.
International Search Report issued in International Patent Application No. PCT/JP2019/034178, dated Oct. 8, 2019, along with English translation thereof.
Office Action issued in Taiwanese Counterpart Patent Appl. No. 108135799, dated Nov. 30, 2021, along with an English translation thereof.
Office Action issued in Taiwanese Counterpart Patent Appl. No. 108135799, dated Jul. 8, 2021, along with an English translation thereof.

* cited by examiner

METHOD FOR MANUFACTURING MOUNTING STRUCTURE FOR ELECTRONIC COMPONENT, MOUNTING STRUCTURE FOR ELECTRONIC COMPONENT, ELECTRONIC MODULE, AND WIRING SHEET

TECHNICAL FIELD

The present invention relates to an electronic component mounting technique for mounting an electronic component on a wiring board.

BACKGROUND ART

A method using an adhesive is known as an example of a method for mounting an electronic component on a wiring board without using heat (for example, soldering). Patent Literature 1 discloses a mounting structure in which an adhesive is used.

Figure 1A:
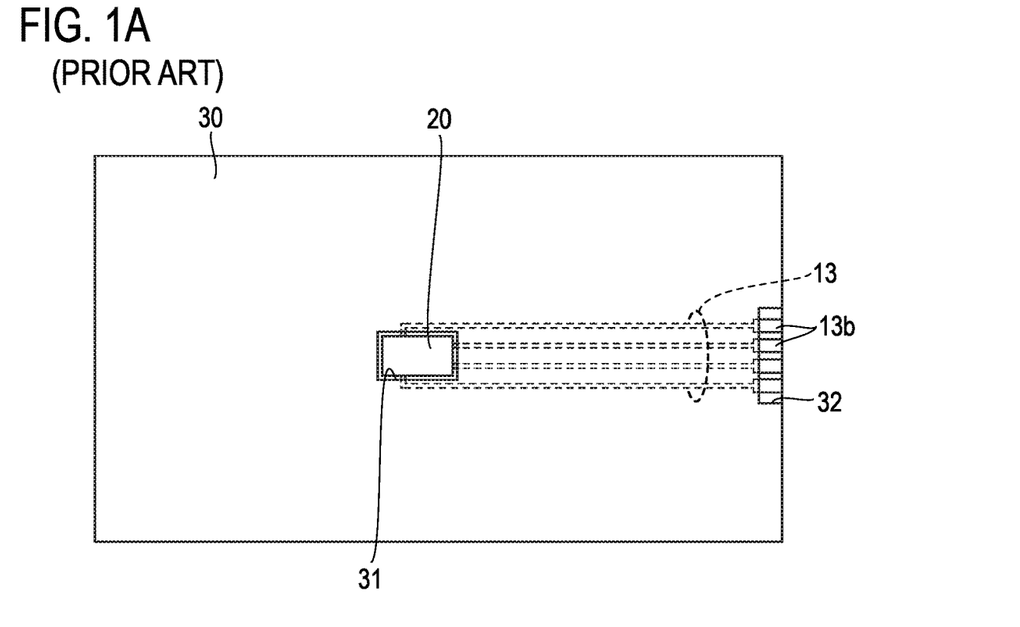
FIG. 1A is a plan view of a mounting structure of a related art.
Figure 1B:
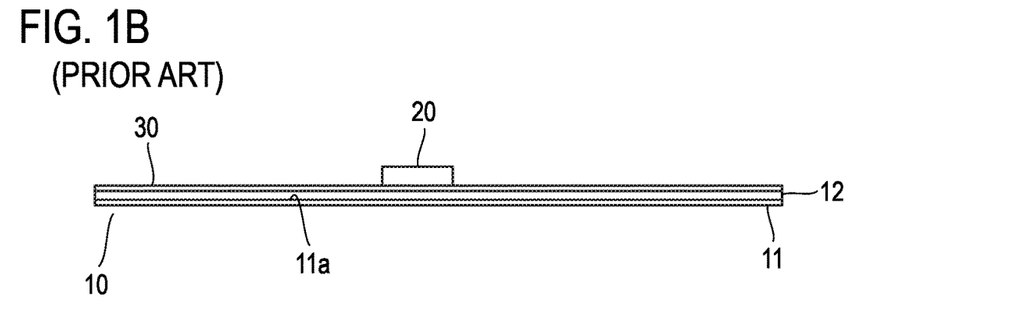
FIG. 1B is a front elevational view of the mounting structure of a related art.
Figure 1C:
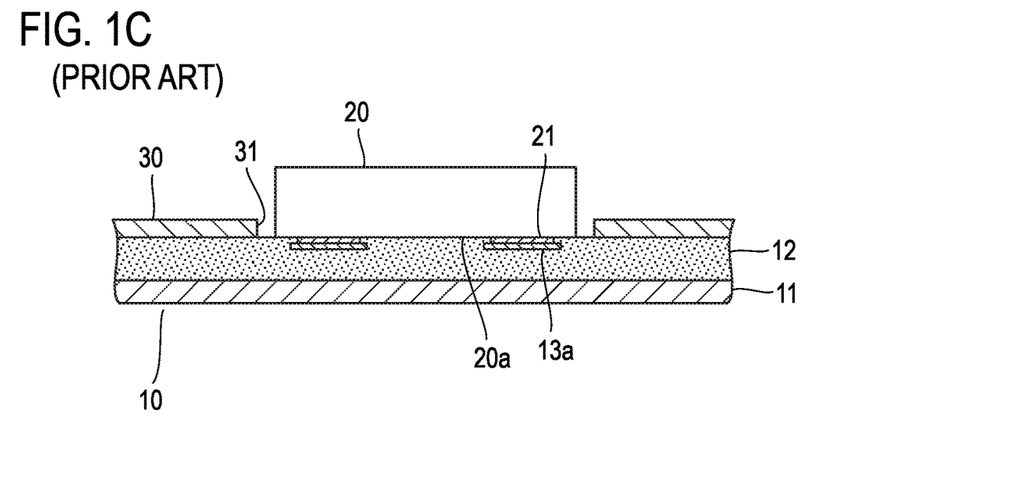
FIG. 1C is a partially enlarged sectional view of the mounting structure of a related art.

FIGS. 1A, 1B, and 1C illustrate the mounting structure disclosed in Patent Literature 1. In this example, a microphone 20 as an electronic component is mounted on a wiring board (referred to as a wiring-attached base material in Patent Literature 1) 10. The microphone 20 is a micro electro mechanical system (MEMS) microphone manufactured by using a MEMS technique.

The wiring board 10 has a structure in which an insulating adhesive layer 12 is formed on one surface 11a of a film 11 and further four conductor patterns 13 are formed on the adhesive layer 12. The adhesive layer 12 is formed on the entire surface of the one surface 11a of the film 11. Lands 13a are respectively formed at one ends of four conductor patterns 13 and lands 13b are respectively formed at the other ends of the same.

The microphone 20 is mounted on the adhesive layer 12 by pressing the microphone 20 onto the adhesive layer 12. In this state, terminals 21 of the microphone 20 are in contact with the lands 13a of the conductor patterns 13 respectively. Part of a bottom surface 20a of the microphone 20, on which the terminals 21 are not formed, adheres to the adhesive layer 12. Accordingly, the microphone 20 and the adhesive layer 12 are mechanically coupled with each other. Elastic restoring force of the adhesive layer 12 acts as a load in a direction pressing the terminals 21 and the lands 13a against each other, being able to provide a favorable and continuous electrical-connection state between the terminals 21 and the lands 13a.

The surface of the wiring board 10 on which the conductor patterns 13 are formed is covered by a cover film 30 other than part on which the microphone 20 is positioned and part on which four lands 13b are positioned. In other words, a window 31 and a cutout 32 are formed on the cover film 30.

PRIOR ART LITERATURE

Patent Literature

Patent Literature 1: Japanese Registered Patent No. 6293938

SUMMARY OF THE INVENTION

Problems to be Solved by the Invention

Patent Literature 1 discloses that the conductor patterns are formed by printing. However, forming a conductor pattern on an adhesive layer is not always easy and forming a wiring board accordingly requires a lot of labor and costs. When many conductor patterns need to be formed on an adhesive layer, this problem becomes more remarkable.

An object of the present invention is to provide an electronic component mounting technique by which increase in a cost for a wiring board can be avoided even in using an adhesive.

Means to Solve the Problems

The following technical matters are described simply to facilitate the understanding of the main points of the present invention, not to limit the invention claimed in the claims explicitly or implicitly and not to express the possibility of accepting such a limitation that is imposed by a person other than those who will benefit from the present invention (for example, the applicant and the right holder).

According to the present invention, a wiring sheet including an adhesive layer interposes between the electronic component and the wiring board and the electronic component is indirectly mounted on the wiring board. The electronic component is directly mounted on the adhesive layer of the wiring sheet and the adhesive layer of the wiring sheet is directly fitted to the wiring board. Conduction between the electronic component and the wiring board is attained in stages by conduction between the electronic component and the wiring sheet and conduction between the wiring sheet and the wiring board.

Effects of the Invention

According to the present invention, since an electronic component is locally mounted on a wiring board by using a wiring sheet on which an adhesive layer is formed, increase in a cost for the wiring board can be avoided even in using an adhesive.

DETAILED DESCRIPTION OF THE EMBODIMENTS

Embodiments of the present invention will be described with reference to the accompanying drawings.

First Embodiment

Figure 2A:
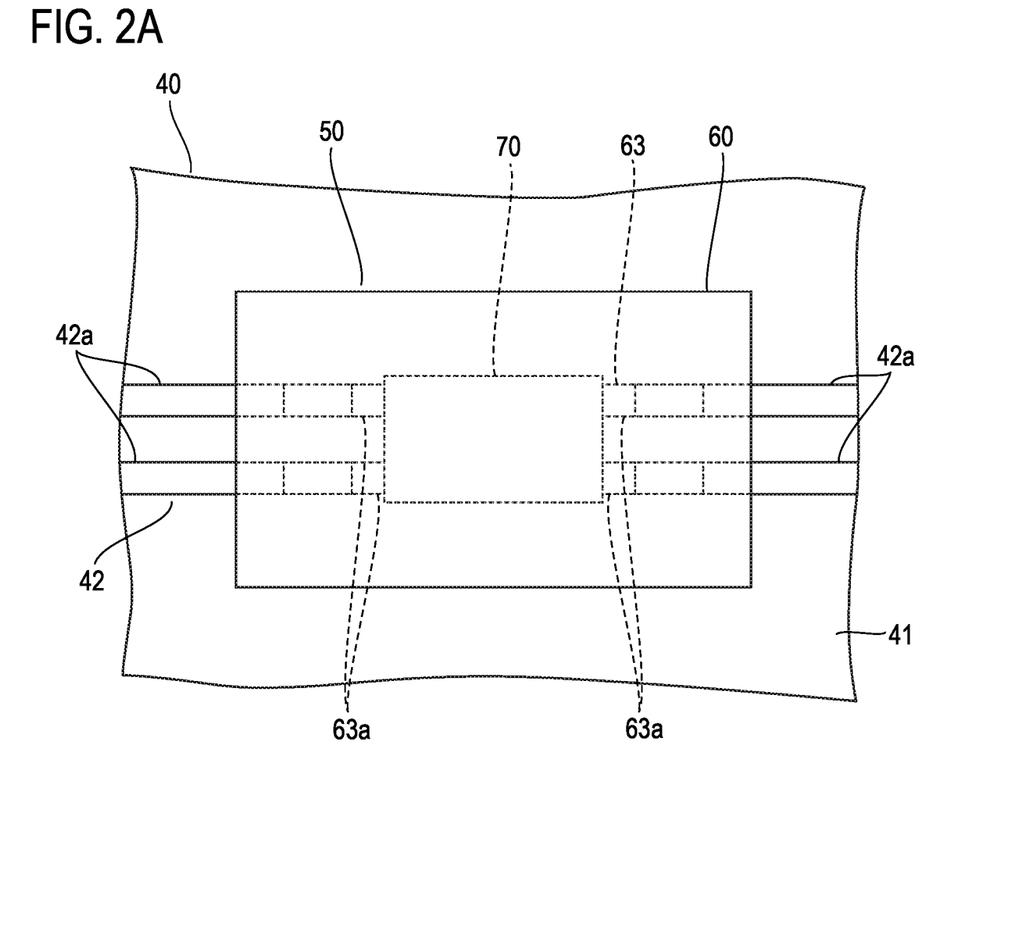
FIG. 2A is a plan view of a mounting structure of a first embodiment.
Figure 2B:
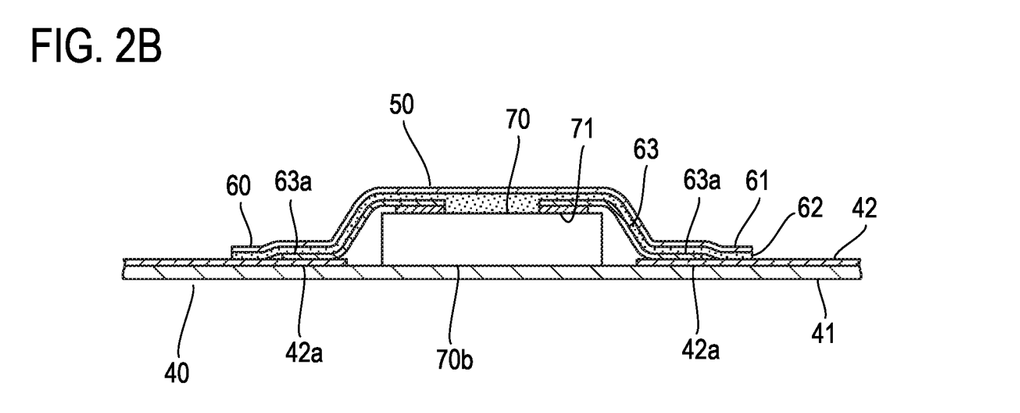
FIG. 2B is a sectional view of the mounting structure of the first embodiment.

FIGS. 2A and 2B illustrate a first embodiment of a mounting structure for electronic component. In this embodiment, an electronic module 50 is first manufactured and the electronic module 50 is then mounted on a wiring board 40 with an adhesive.

Figure 3A:
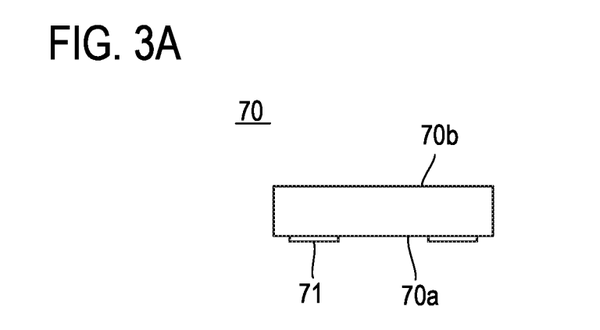
FIG. 3A is a front elevational view of an electronic component.
Figure 3B:
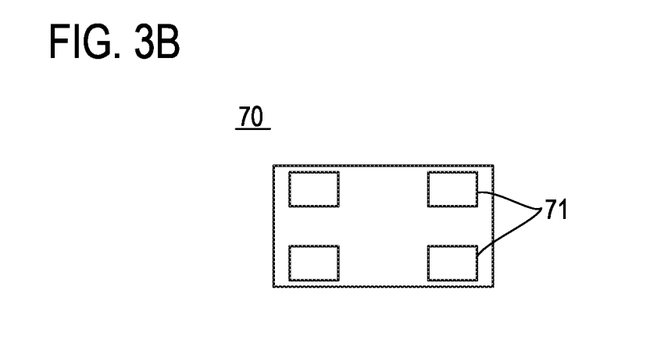
FIG. 3B is a bottom view of the electronic component.

The electronic module 50 includes a wiring sheet 60 and an electronic component 70 which is mounted on the wiring sheet 60. The electronic component 70 has a rectangular parallelepiped shape in this example and includes four terminals 71 provided on a bottom surface 70a of the electronic component 70 (see FIGS. 3A and 3B).

Figure 4A:
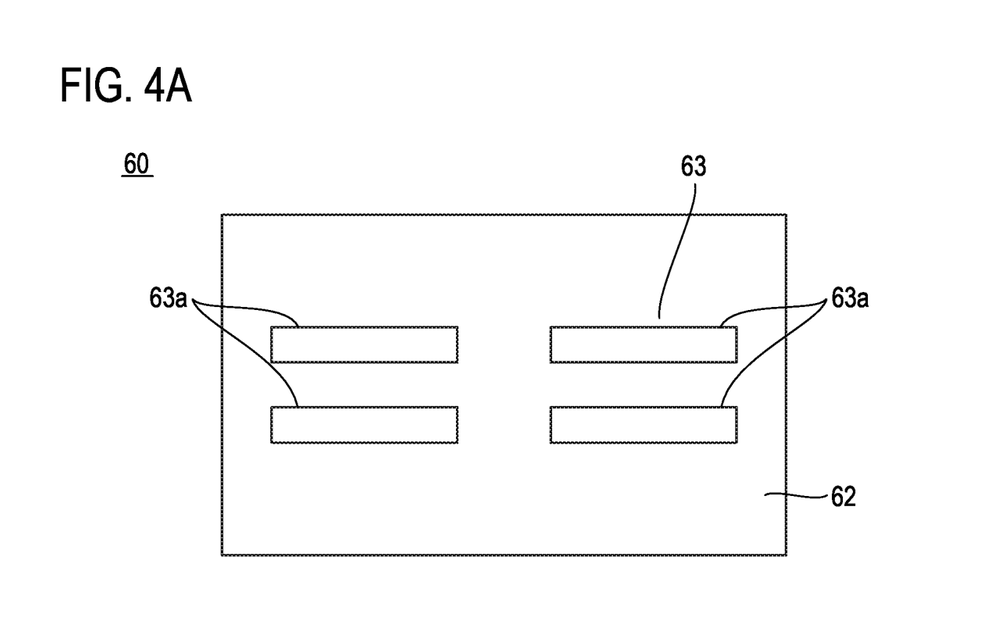
FIG. 4A is a plan view of a wiring sheet.
Figure 4B:
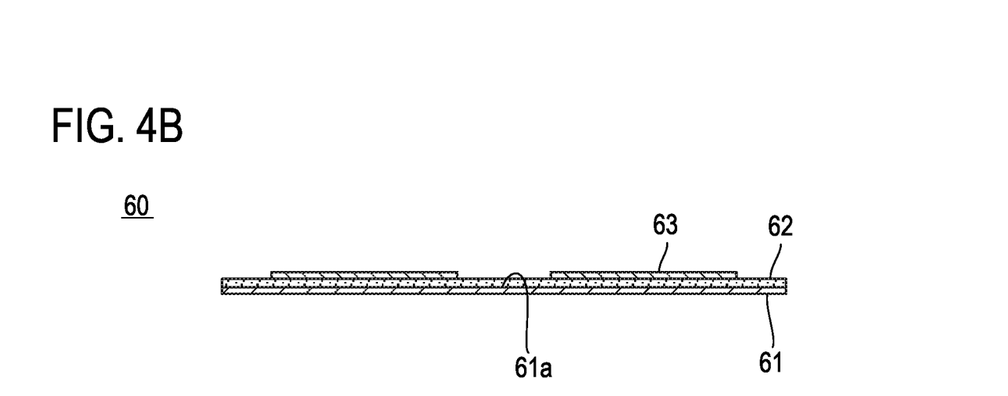
FIG. 4B is a sectional view of the wiring sheet.

The wiring sheet 60 has a structure in which an insulating adhesive layer 62, which is elastically deformable, is formed on one surface 61a of a base 61 and further a conductor pattern 63 is formed on the adhesive layer 62 (see FIGS. 4A and 4B). The adhesive layer 62 is formed on the entire surface of the one surface 61a of the base 61.

The conductor pattern 63 includes four conductive wires 63a in the present embodiment. Two conductive wires 63a are arranged on the right half of the wiring sheet 60 having the rectangular parallelepiped shape and the rest two conductive wires 63a are arranged on the left half of the same. Inside ends of the four conductive wires 63a are parts which directly come into contact with the four terminals 71 of the electronic component 70 respectively. The four conductive wires 63a extend in a direction parallel to the long side of the wiring sheet 60. An outside end of each of the conductive wires 63a extends toward the short side of the wiring sheet 60 and is away from the short side by a predetermined distance.

In the wiring sheet 60, the base 61 is a film base member having flexibility. Examples of a material of the film base member include polyethylene terephthalate (PET), polyethylene naphthalate (PEN), and polyimide (PI).

Examples of an adhesive for the adhesive layer 62 include polyester based-, polyurethane based-, acrylic based-, epoxy based-, phenolic based-, silicone based-, polyolefin based-, polyimide based-, vinyl based-, and natural polymer based-polymers. Polymer may be composed of one kind of monomer or may be composed of two kinds of monomers.

Further, in order to improve an adherence property or a mechanical property, polyester based-, polyurethane based-, acrylic based-, epoxy based-, phenolic based-, silicone based-, polyolefin based-, polyimide based-, and vinyl based-monomers or oligomers, for example, may be mixed with the polymers.

The conductor pattern 63 is formed by printing with silver paste (silver ink), for example. Plating may also be employed for forming the conductor pattern 63.

Figure 5A:
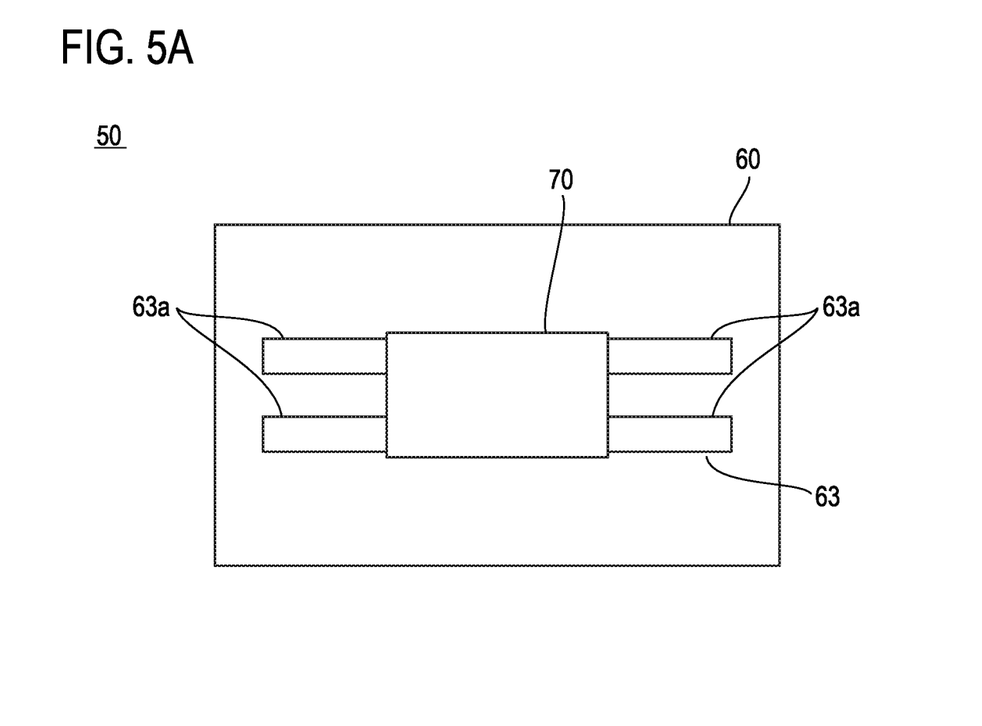
FIG. 5A is a plan view of an electronic module.
Figure 5B:
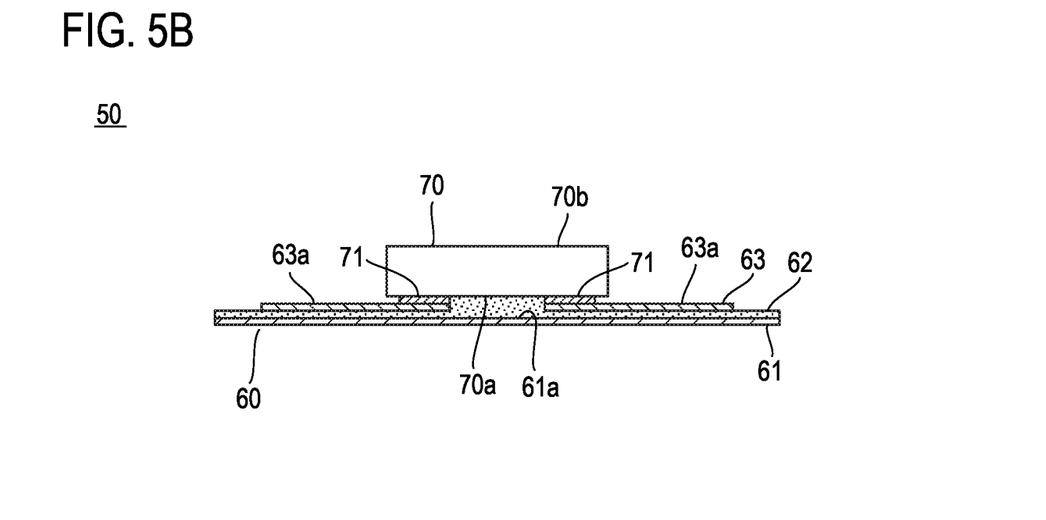
FIG. 5B is a sectional view of the electronic module.

FIGS. 5A and 5B illustrate the electronic module 50. The electronic component 70 is pressed onto the adhesive layer 62, being directly mounted on the wiring sheet 60 (step S1). The four terminals 71 are directly in contact with inside ends of the four conductive wires 63a, respectively.

The terminals 71 of the electronic component 70 directly come into contact with the conductor pattern 63, being electrically connected with the conductor pattern 63. Part of the bottom surface 70a of the electronic component 70, on which the terminals 71 are not formed, adheres to the adhesive layer 62, being mechanically coupled with the adhesive layer 62 (see FIG. 5B). That is, the mechanical coupling between the adhesive layer 62 and the electronic component 70 is realized by sticking a part of the surface of the electronic component 70 to a part of the surface of the adhesive layer 62.

Elastic restoring force of the adhesive layer 62 acts as a load in a direction pressing the terminals 71 of the electronic component 70 and the conductor pattern 63 against each other, so that the terminals 71 are reliably and electrically connected with the conductor pattern 63.

In the present embodiment, an electronic component mounting structure in which the electronic component 70 is mounted on the wiring board 40 is manufactured by mounting the electronic module 50 on the wiring board 40.

The wiring board 40 is a common wiring board obtained by forming a conductor pattern on a base 41. The wiring board 40 is a flexible printed wiring board and a material of the base 41 is a film base material in the present embodiment. FIGS. 2A and 2B illustrate only a part of the wiring board 40 on which the electronic component 70 is mounted and omit illustration of an entire shape and a detailed structure of the wiring board 40. A conductor pattern 42 including four conductive wires 42a is formed on part of the wiring board 40 on which the electronic component 70 is mounted. The four conductive wires 42a directly come into contact with the four conductive wires 63a of the electronic module 50 respectively.

Mounting of the electronic module 50 onto the wiring board 40 is performed as follows.

A mounting structure is manufactured by directly mounting the electronic module onto the wiring board (step S2). The electronic component 70 of the electronic module 50 is opposed to the surface of the wiring board 40 on which the conductor pattern 42 is formed. The four conductive wires 63a of the conductor pattern 63 are set to respectively face the four conductive wires 42a of the conductor pattern 42 of the wiring board 40. The electronic module 50 is pressed against the wiring board 40 by pressing the whole of the electronic module 50. Part of the wiring sheet 60, which is positioned around the electronic component 70, deforms and outside ends of the four conductive wires 63a of the conductor pattern 63 directly come into contact with the conductive wires 42a of the conductor pattern 42 of the wiring board 40 respectively. Consequently, the wiring sheet 60 is electrically connected with the wiring board 40. An upper surface 70b of the electronic component 70 is directly in contact with the base 41 of the wiring board 40.

The adhesive layer 62 which is brought into direct contact with a board surface of the wiring board 40 by the deformation of the wiring sheet 60 adheres to the wiring board 40 and accordingly, the adhesive layer 62 and the wiring board 40 are mechanically coupled with each other. That is, the mechanical coupling between the adhesive layer 62 and the wiring board 40 is realized by sticking a part of the adhesive layer 62 (specifically, at least part of a surface on which the conductor pattern 63 is not formed and the electronic component 70 is not bonded) to a part of at least one of a surface of the conductor pattern 42 and a surface of the base 41, on which the conductor pattern 42 is not formed, on the wiring board 40. The mechanical coupling part between the adhesive layer 62 and the wiring board 40 surrounds the periphery of the electronic component 70.

The elastic restoring force of the adhesive layer 62 acts as a load in a direction pressing the conductor pattern 63 and the conductor pattern 42 of the wiring board 40 against each other, so that the conductor pattern 63 is reliably and electrically connected with the conductor pattern 42.

The first embodiment of the electronic component mounting structure has been described with the method for manufacturing the mounting structure thus far. According to the first embodiment, the following advantageous effects are obtained.

(1) Since an adhesive is used, an electronic component can be easily mounted on a wiring board. In the present embodiment, the electronic module 50 is first manufactured by mounting the electronic component 70 on the adhesive layer 62 of the wiring sheet 60 and the adhesive layer 62 of the electronic module 50 is then locally fitted to a fitting part of the wiring board 40. Thus, there is no need for forming an adhesive layer on the entire surface of a wiring board and, that is, a common wiring board having no adhesive layer can be employed. Accordingly, cost increase for a wiring board can be avoided.

(2) An electronic module including an electronic component can be manufactured as a module common to various types of wiring board or as a general-purpose module. Accordingly, improvement of production efficiency can be expected.

(3) The mounting structure according to the present embodiment is sandwiched between the wiring board and the wiring sheet which adhere to each other. Especially, employing the structure in which the electronic component is covered by the wiring board and the wiring sheet, more specifically, the structure in which the electronic component is placed in the inside of a closed space, which is formed by a closed loop-shaped adhering portion, between the adhesive layer and the wiring board, the electronic component is not exposed to the outside. That is, waterproofness of the electronic component is ensured.

(4) According to the prior art mounting structure (see FIGS. 1A to 1C), an adhering area between the electronic component 20 and the adhesive layer 12 is small. If the wiring board 10 is bent so that a surface on which the electronic component is mounted faces outside, there is a possibility occurring a failure in which the terminals 21 of the electronic component 20 separate from the conductor patterns 13 or a failure in which the electronic component 20 drops off. However, the electronic component 70 is sandwiched between the wiring sheet 60 and the wiring board 40 and the adhering area between the adhesive layer 62 of the wiring sheet 60 and the wiring board 40 is largely increased in the present embodiment, being able to prevent occurrence of such failures. Thus, a mounting structure being tolerant to bending and exhibiting high reliability is realized.

Second Embodiment

Figure 6:
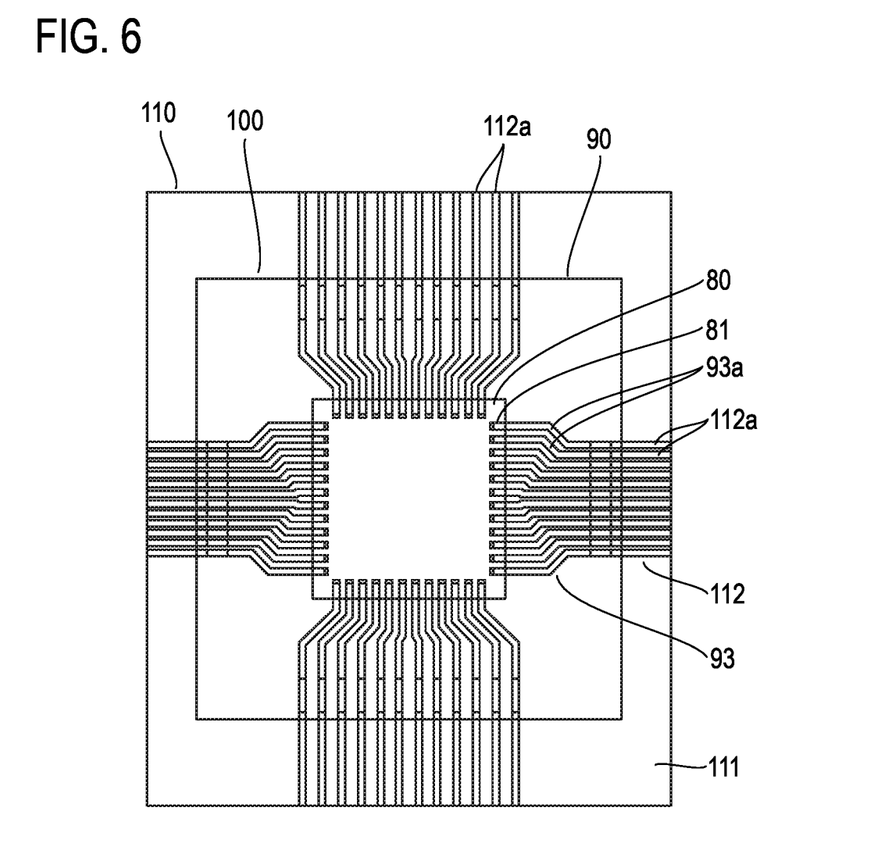
FIG. 6 is a plan view of a mounting structure of a second embodiment (partially a transparent view).

A conductor pattern of a wiring sheet serves to relay a terminal of an electronic component and a conductor pattern of a wiring board to each other. In the first embodiment, two conductive wires 63a of the conductor pattern 63 extend in parallel at a constant arrangement space on the right side of the electronic component 70 and the rest two conductive wires 63a of the conductor pattern 63 extend in parallel at a constant arrangement space on the left side of the electronic component 70 (see FIG. 4A). On the other hand, in a second embodiment, a conductor pattern of a wiring sheet includes two or more conductive wires, a space between adjacent two conductive wires of which changing along an extending direction of the adjacent two conductive wires. FIG. 6 illustrates a mounting structure for electronic component according to the second embodiment. Each drawing illustrates only part of a wiring board 110 on which an electronic component 80 is mounted.

Figure 7A:
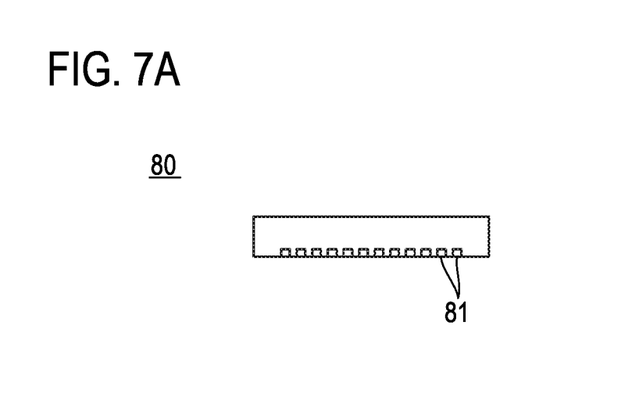
FIG. 7A is a front elevational view of an electronic component.
Figure 7B:
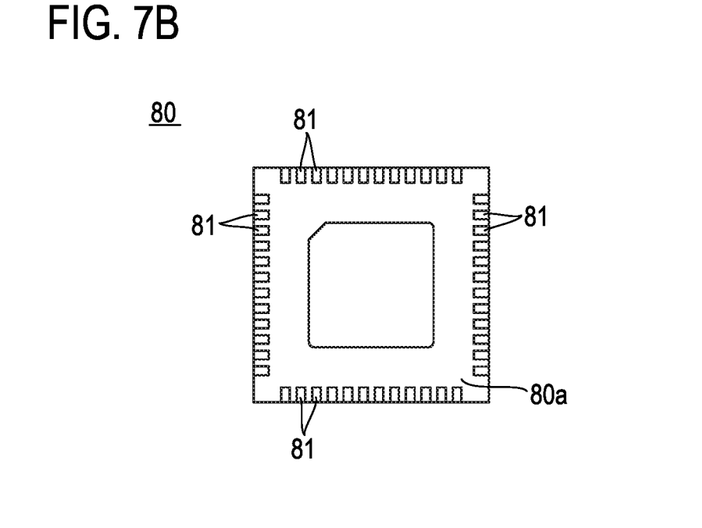
FIG. 7B is a bottom view of the electronic component.

The electronic component 80 is a microcomputer chip which can be mounted on a surface of a substrate or the like. On each of four sides of a square bottom surface 80a of the electronic component 80, twelve terminals 81 are arranged (see FIGS. 7A and 7B).

Figure 8A:
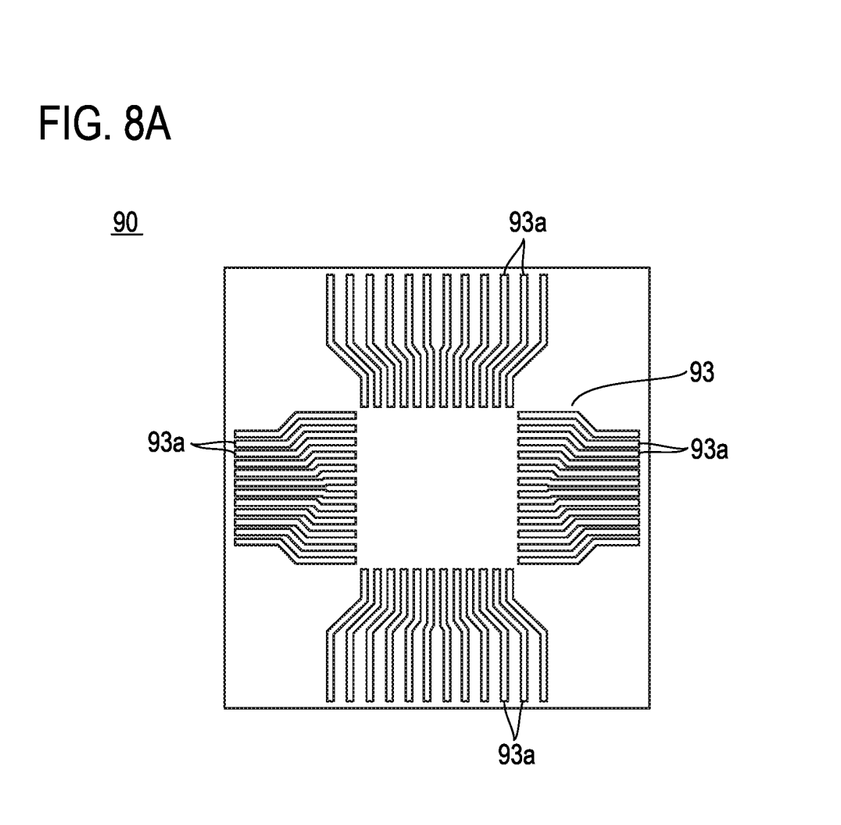
FIG. 8A is a plan view of a wiring sheet.
Figure 8B:
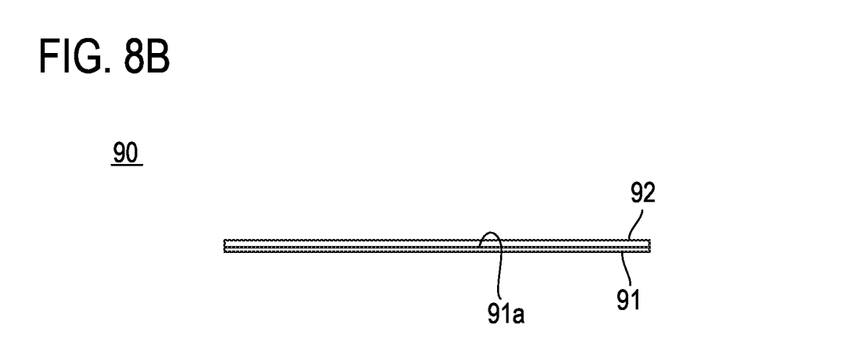
FIG. 8B is a front elevational view of the wiring sheet.

As is the case with the wiring sheet 60, an adhesive layer 92 is formed on the whole of one surface 91a of a base 91 of a wiring sheet 90 (see FIG. 8B). A conductor pattern 93 is formed on the adhesive layer 92. The conductor pattern 93 is much thinner than the base 91 and the adhesive layer 92, so that FIG. 8B omits illustration of the conductor pattern 93. The conductor pattern 93 includes forty-eight conductive wires 93a. From each of four sides of the square wiring sheet 90, twelve conductive wires 93a extend toward the center of the wiring sheet 90. Inside ends of the forty-eight conductive wires 93a directly come into contact with the forty-eight terminals 81 of the electronic component 80 respectively. Outside ends of the forty-eight conductive wires 93a are away from edges of the wiring sheet 90 by a predetermined distance. Constituent materials of the base 91 and the adhesive layer 92 are respectively the same as those of the base 61 and the adhesive layer 62 of the first embodiment.

Regarding the forty-eight conductive wires 93a, a space between two adjacent conductive wires 93a changes along the extending direction of the two adjacent conductive wires 93a (see FIG. 8A). Regarding twelve conductive wires 93a extending from an upper side of the wiring sheet 90, a space between inside ends of two adjacent conductive wires 93a is narrower than a space between outside ends of the same. Similarly, regarding twelve conductive wires 93a extending from a lower side of the wiring sheet 90, a space between inside ends of two adjacent conductive wires 93a is narrower than a space between outside ends of the same. Regarding twelve conductive wires 93a extending from a right side of the wiring sheet 90, a space between inside ends of two adjacent conductive wires 93a is wider than a space between outside ends of the same. Similarly, regarding twelve conductive wires 93a extending from a left side of the wiring sheet 90, a space between inside ends of two adjacent conductive wires 93a is wider than a space between outside ends of the same.

Figure 9:
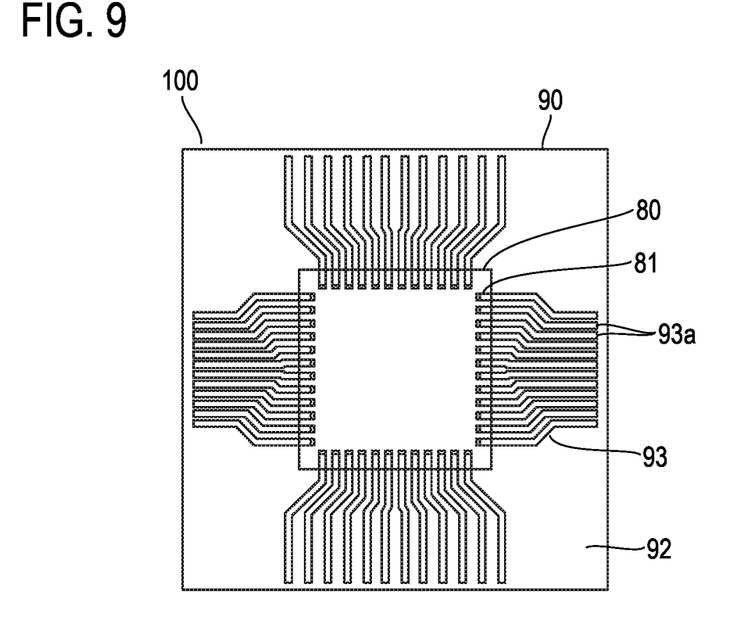
FIG. 9 is a plan view of an electronic module (partially a transparent view).

An electronic module 100 illustrated in FIG. 9 is manufactured by mounting the electronic component 80 on the wiring sheet 90.

Figure 10:
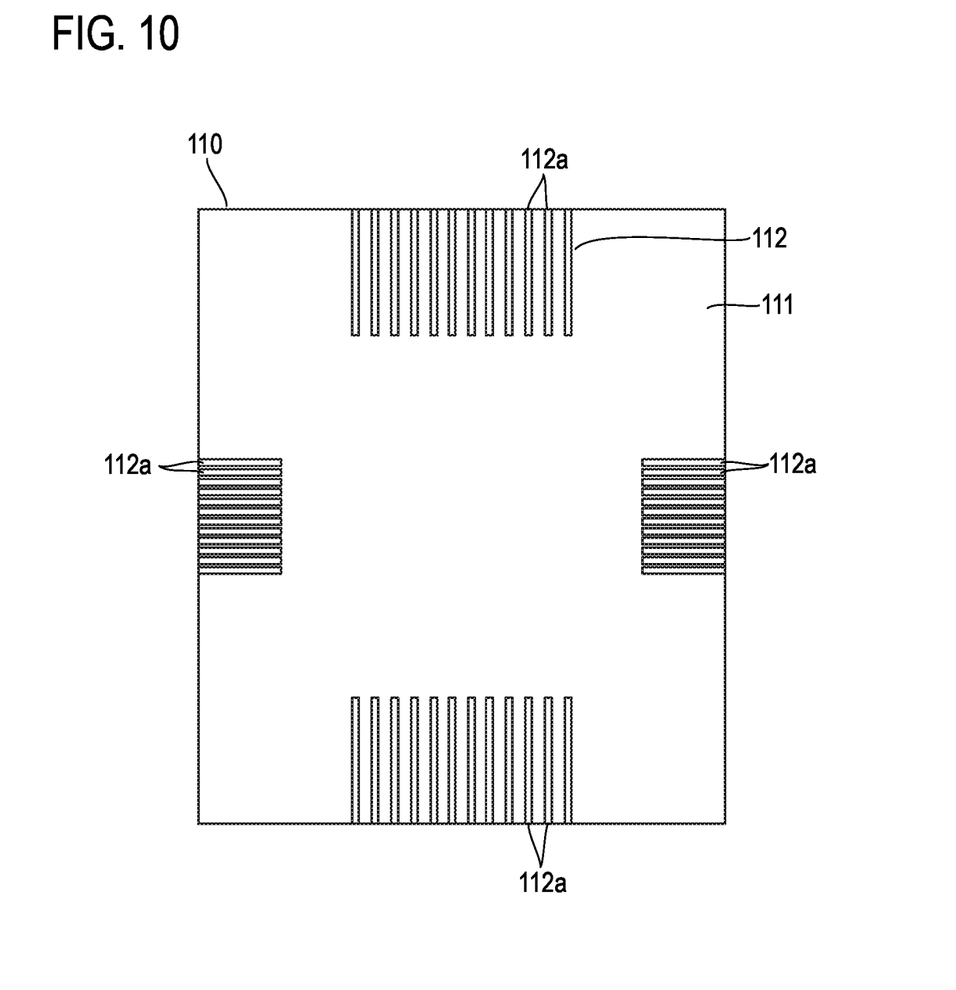
FIG. 10 is a plan view of a wiring board.

The wiring board 110 is a flexible printed wiring board as is the case with the wiring board 40 according to the first embodiment. A predetermined conductor pattern 112 is formed on a base 111. The conductor pattern 112 includes forty-eight conductive wires 112a. The forty-eight conductive wires 112a of the conductor pattern 112 directly come into contact with the forty-eight conductive wires 93a of the conductor pattern 93 respectively.

By mounting the electronic module 100 on the wiring board 110, an electronic component mounting structure in which the electronic component 80 is mounted on the wiring board 110 is manufactured. Mechanical coupling between the adhesive layer 92 and the electronic component 80 and mechanical coupling between the adhesive layer 92 and the wiring board 110 are the same as those of the first embodiment.

Third Embodiment

The wiring board 40 and the wiring board 110 are flexible printed wiring boards and a material of the base 41 and the base 111 is a film base material having flexibility in the first and second embodiments. However, the material of the base 41 and the base 111 may be a rigid base material having no flexibility.

As long as conditions such as the thickness of an adhesive layer are sufficiently satisfied and mechanical coupling by adherence is attained, one or both of the base of the wiring board and the base of the wiring sheet may be made of a rigid base material.

Figure 11:
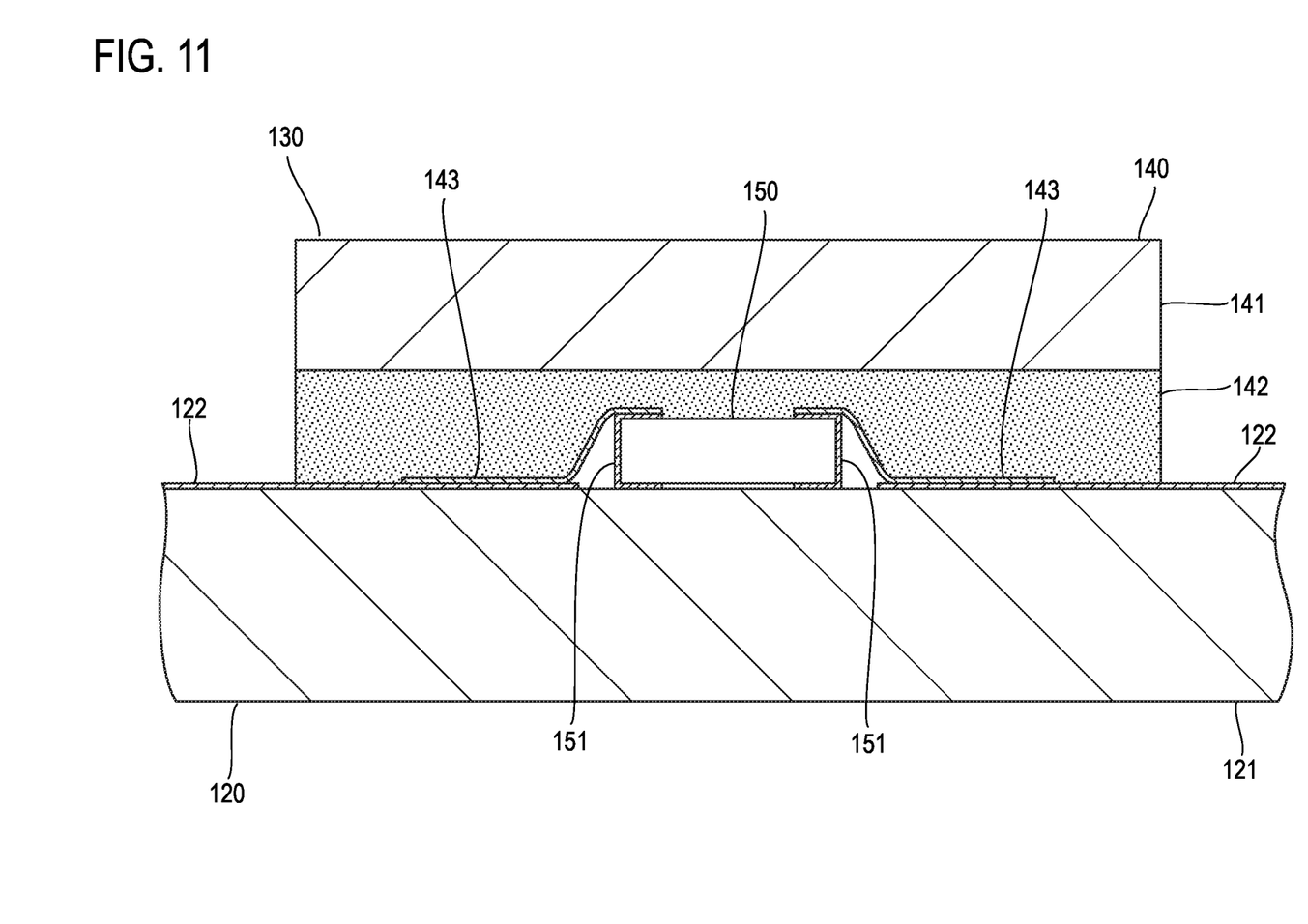
FIG. 11 is a sectional view of a mounting structure of a third embodiment.
Figure 12:
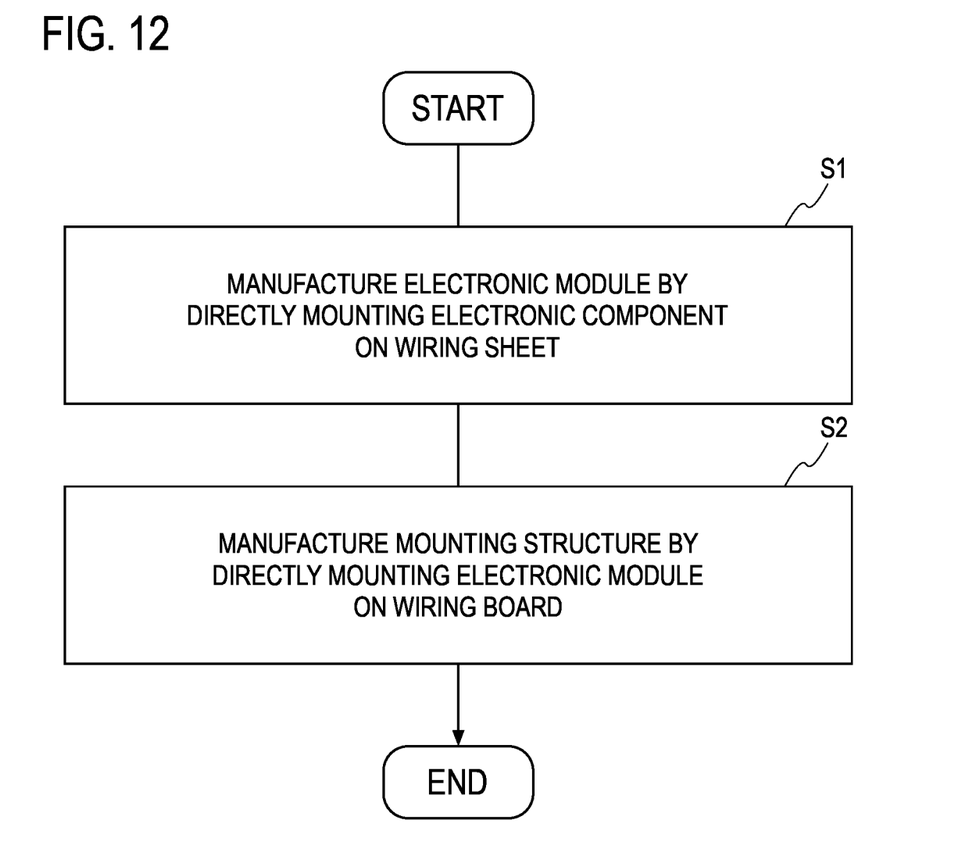
FIG. 12 illustrates a processing flow of a manufacturing method.

FIG. 11 illustrates a mounting structure for an electronic component 150 in which a base 121 of a wiring board 120 and a base 141 of a wiring sheet 140 of an electronic module 130 are made of a rigid base material, as a third embodiment.

Even when the base 121 and the base 141 are rigid, the mounting structure for electronic component illustrated in FIG. 11 can be realized by forming an adhesive layer 142 thicker than an electronic component 150, which is sufficiently-small and thin chip resistor, for example. In FIG. 11, the reference character 143 denotes a conductor pattern of the wiring sheet 140, the reference character 122 denotes a conductor pattern of the wiring board 120, and the reference character 151 denotes a terminal of the electronic component 150.

Fourth Embodiment

Not illustrated in drawings, in the electronic component 150 provided with the terminal 151 which extends from a bottom surface facing the base 141 to a surface facing the wiring board 120, the conductor pattern 122 of the wiring board 120 may be not only brought into direct contact with the conductor pattern 143 but also brought into direct contact with a part of the terminal 151 which faces the wiring board 120. That is, for the mounting of an electronic component provided with a terminal which extends to both of front and back surfaces of the electronic component, a mounting structure may be employed in which the terminal of the electronic component is sandwiched between a conductor pattern of a wiring board and a conductor pattern of a wiring sheet. It goes without saying that such mounting structure can be employed irrespective of whether or not a material of a base of the wiring board or a material of a base of a wiring sheet has flexibility.

In the specification and the claims, an ordinal numeral ("the -st/-nd/-rd/-th", for example, obtained by combining a prefix "the" and a Chinese character figure or an Arabic figure) is not intended to limit an element modified by or coupled to the ordinal numeral by an ordinal position or the amount of the element regardless of a definition of the ordinal numeral, unless otherwise noted. An ordinal numeral is merely used as a convenient expression method to distinguish two or more elements from one another, unless otherwise noted. Thus, for example, the phrase "the first X" and the phrase "the second X" are expressions to distinguish between the two Xs, do not necessarily mean that the total number of Xs is 2, and do not necessarily means that the first X has to come before the second X.

In the specification and the claims, the term "include" and inflected forms thereof are used as non-exclusive expressions. For example, the sentence "X includes A and B" does not deny that X includes a component other than A and B (for example, C). If a certain sentence in the specification and the claims includes a phrase in which the term "include" or an inflected form thereof is coupled to a negative word, the sentence only mentions an object thereof. Thus, for example, the sentence "X does not include A and B" admits a possibility that X includes a component other than A and B. Additionally, the term "or" used in the specification and the claims is intended not to mean an exclusive OR.

When an article or a part of speech related to an article such as "a", "an", and "the" in English are added through translation in the present disclosure, nouns following the part of speech may include the plural form thereof in the present disclosure.

The embodiments according to the present invention have been described above, but the present invention is not limited to these embodiments. Various alterations and modifications may be made within a scope of the gist of the present invention. The embodiments that are selected and described are provided for explaining the principle and practical applications of the present invention. The present invention is applied in various embodiments obtained through various alterations or modifications and the various alterations or modifications are determined depending on expected applications. All of such alterations or modifications are intended to be included in the scope of the present invention defined by the accompanied claims, and all of such alterations or modifications are intended to be granted the same protection when they are interpreted in accordance with the scope given fairly, legally, and justly.

What is claimed is:

1. A method for mounting an electronic component, including a terminal, to a wiring board including a first base and a first conductor pattern on the first base, the method comprising:
    manufacturing an electronic module by directly mounting the electronic component on a wiring sheet including a second base, an insulating adhesive layer on the second base, and a second conductor pattern on the adhesive layer, wherein the terminal of the electronic component is in contact with the second conductor pattern, and at least a part of a surface of the electronic component that the terminal is not located on adheres to at least a part of a surface of the adhesive layer that the second conductor pattern is not located on; and
    directly mounting the electronic module on the wiring board, wherein the second conductor pattern is in contact with the first conductor pattern, and at least a part of the surface of the adhesive layer adheres to at least a part of a surface of the wiring board.

2. The method according to claim 1, wherein a material of at least one of the first base or the second base is a film base material.

3. The method according to claim 1, wherein
    the second conductor pattern includes two or more conductive wires, and
    a space between two adjacent conductive wires among the two or more conductive wires changes along an extending direction of the two adjacent conductive wires.

4. The method according to claim 2, wherein
    the second conductor pattern includes two or more conductive wires, and a space between two adjacent conductive wires among the two or more conductive wires changes along an extending direction of the two adjacent conductive wires.

* * * * *